United States Patent [19]
Kraus et al.

[11] Patent Number: 5,774,392
[45] Date of Patent: Jun. 30, 1998

[54] BOOTSTRAPPING CIRCUIT UTILIZING A FERROELECTRIC CAPACITOR

[75] Inventors: William F. Kraus; Dennis R. Wilson, both of Colorado Springs, Colo.

[73] Assignee: Ramtron International Corporation, Colorado Springs, Colo.

[21] Appl. No.: 620,799

[22] Filed: Mar. 28, 1996

[51] Int. Cl.$^6$ .................................................. G11C 11/24
[52] U.S. Cl. .................. 365/145; 365/149; 365/230.06; 327/589
[58] Field of Search .............................. 365/145, 230.06, 365/149, 65; 327/589, 536

[56] References Cited

U.S. PATENT DOCUMENTS

| | | |
|---|---|---|
| 4,291,393 | 9/1981 | Wilson . |
| 4,397,003 | 8/1983 | Wilson et al. . |
| 5,128,563 | 7/1992 | Hush et al. . |
| 5,146,299 | 9/1992 | Lampe et al. .......................... 365/145 X |
| 5,329,186 | 7/1994 | Hush et al. . |
| 5,345,415 | 9/1994 | Nakao et al. ............................ 365/145 |
| 5,349,247 | 9/1994 | Hush et al. . |
| 5,361,237 | 11/1994 | Chishiki ............................. 365/230.06 |
| 5,608,667 | 3/1997 | Osawa ...................................... 365/145 |
| 5,610,519 | 3/1997 | Choi ........................................ 327/536 |

OTHER PUBLICATIONS

Declaration of Dennis R. Wilson, Aug. 5, 1996.

*Primary Examiner*—David C. Nelms
*Assistant Examiner*—Huan Hoang
*Attorney, Agent, or Firm*—Peter J. Meza, Esq.

[57] ABSTRACT

A ferroelectric memory array includes a word line coupled to a row of ferroelectric memory cells and a word line driver circuit for establishing a full power supply voltage on the word line. A bootstrapping circuit is coupled between the word line and a boost line for receiving a boost signal. The bootstrapping circuit includes a ferroelectric capacitor and coupling circuitry for coupling the ferroelectric capacitor between the boost line and the word line in a first operational mode such that the peak voltage on the word line is greater than the power supply voltage, and for isolating the ferroelectric capacitor from the boost line in a second operational mode. In operation, a selected word line is precharged to a full VDD power supply voltage, the ferroelectric capacitor associated with the selected word line is coupled to the boost line, the ferroelectric capacitors associated with non-selected word lines are electrically isolated from the boost line, and the boost line transitions from zero volts to VDD such that the voltage on the selected word line is boosted to a voltage greater than the VDD power supply voltage.

19 Claims, 10 Drawing Sheets

BOOTSTRAPPING CIRCUIT UTILIZING A FERROELECTRIC CAPACITOR

BACKGROUND OF THE INVENTION

This invention relates generally to integrated circuit memories and more particularly to ferroelectric nonvolatile random access memories and integrated circuits utilizing a ferroelectric process that requires an internal boosted voltage.

A portion of a ferroelectric nonvolatile random access memory array 10 is shown in FIG. 1, including a word line bootstrapping circuit. The word line bootstrapping circuit is used to provide a boosted voltage greater than the VDD power supply voltage to the word line so that the full VDD power supply voltage is applied across the ferroelectric capacitor or capacitors in the accessed ferroelectric memory cells. The memory array 10 includes a word line decoder 12 for providing a word line enable signal to a column of word line driver circuits 14. Four word line driver circuits 14 are shown receiving word line enable signals WLEN1, WLEN2, WLEN3, and WLENN. In a typical memory array there are N rows, where N is usually a power of two. In turn, the word line drivers 14 provide a full VDD power supply voltage (typically five, 3.3, or three volts) to word lines or word line segments WL1, WL2, WL3, and WLN. Four representative ferroelectric memory cells 16A–16D are shown coupled to each word line. The bit line and plate line connections to memory cells 16A–16D are not shown in FIG. 1. Memory cells 16A–16D can be one-transistor, one-capacitor cells, two-transistor, two-capacitor cells, or any other type of ferroelectric memory cell having a word line connection. Each of the word lines are coupled to a single BootDrive line 20 through an MOS capacitor 18. Each capacitor 18 is actually an N-channel MOS transistor in which the gate, coupled to a word line, forms one of the capacitor plates, and the coupled source and drain, coupled to BootDrive line 20, forms the other capacitor plate. A voltage of at least $V_{TN}$ (N-channel transistor threshold voltage) must be applied across a capacitor 18 in order for a channel to be formed that results in a significantly higher value of capacitance to be developed.

Each MOS capacitor 18 provides a maximum capacitive load to the BootDrive line 20 only if the corresponding word line is selected. The MOS capacitors 18 coupled to deselected word lines have a much smaller capacitive load since the low voltage on the word line does not form a channel in the capacitor. However, as memory cells 16A–16D become smaller, the area consumption of MOS capacitors 18 can become an undesirably high percentage of the total die area since the MOS capacitor 18 must fit "in pitch", i.e. into the dimensions of one row of memory cells 16A–16D. This can result in an extreme aspect ratio for the MOS capacitor cell, as high as 20:1. Thus, the MOS capacitor 18 can become a significant portion of the total die area.

Referring now to FIG. 2, a schematic diagram is shown for the driver circuit 14. Word line driver circuit 14 includes a first NMOS transistor 26 having a first current node coupled to a word line enable signal WLEN at node 36. The WLEN signal is a control signal that is at ground potential for deselected rows and is at VDD for a selected row. Transistor 26 also includes a gate coupled to a source of supply voltage (the VDD rail voltage), and a second current node labeled WL' at node 30. A second NMOS transistor 28 has a first current node coupled to the word line WL at node 24, a second current node coupled to a word clock line WLCLK at node 32, and a gate coupled to the second current node WL' of the first NMOS transistor 26 at node 30. After WLEN is driven to VDD, WLCLK is driven high, coupling a boosted voltage into WL' node 30, which allows transistor 28 to drive WL node 24 to a full VDD potential.

Referring now to FIG. 3, a layout diagram is shown for the prior art memory array described in conjunction with FIGS. 1 and 2. The layout 10' includes four rows, or word line segments labeled WL1 through WLN. Each row includes word line decode and word line driver circuitry 12 and 14, labeled WLDECODE+WLDRIVER. The aspect ratio of this circuitry is about 20:1. Each row also includes an MOS capacitor 18 for boosting the voltage level of the word line, which is described in further detail below, labeled BOOT CAP. The aspect ratio of this capacitor can be about 20:1. Each row also includes the memory cells 16 associated with the word line or word line segment. In FIG. 3, eight such cells are associated with each word line or segment, with each cell having an aspect ratio of about 1:1.

The operation of the prior art word line boosting scheme is illustrated by the timing diagram of FIG. 4. At some initial time t0, the word line or segment and the BootDrive line 20 are both at ground potential. At some time between time t0 and time t1, the WLEN signal is brought high. At time t1, the word line transitions to a full VDD potential by the action of the word line driver circuit 14. At time t2, the word line driver circuit 14 is "tri-stated" by bringing the WLEN and, in turn, the WL' signals low, which isolates the word lines or segments WL1 through WLN from the word line decoder 12. At time t3, the BootDrive signal on line 20 is brought high, which boosts the level of the word line to a voltage above the VDD power supply voltage, ideally to a level of at least VDD+$V_{TN}$+VMARGIN volts. The margin voltage, VMARGIN, is typically 0.5 volts, but can be changed as required by process variables and other design considerations. The increased voltage ensures that there will be no voltage drop across the access transistor inside the ferroelectric memory cell, and therefore the full VDD voltage is available to polarize the ferroelectric capacitor in the cell.

While the prior art memory array 10 achieves superior performance by the boosting of the word lines, it is at the cost of increased die size. The area devoted to the capacitor 18, shown in FIG. 3, is significant, since each word line or word line segment, must include a capacitor. A high aspect ratio is the result of a large capacitor 18 being needed to boost the word line or segment, and a relatively low dielectric constant for silicon dioxide, which is the dielectric material for the MOS capacitor 18.

An alternative prior art memory array 40 is shown in FIG. 5, which eliminates the MOS capacitors 18 and the BootDrive line 20, and includes a charge pump method for increasing the voltage level on the word lines. Memory array 40 includes a word line decoder 12 for providing a word line enable signal to a column of word line driver circuits 34. Four word line driver circuits 34 are shown receiving word line enable signals WLEN1, WLEN2, WLEN3, and WLENN. Word line driver circuits 34 also includes an input for receiving a boosted voltage from charge pump 36. In turn, the word line drivers 34 provide a boosted voltage to word lines or word line segments WL1, WL2, WL3, and WLN. Four representative ferroelectric memory cells 16A–16D are shown coupled to each word line.

Referring now to FIG. 6, a schematic diagram is shown for the word line driver circuit 34. Word line driver circuit 14 includes a first NMOS transistor 26 having a first current node coupled to a low voltage word line enable signal WLEN at node 36. Transistor 26 also includes a gate coupled to a source of supply voltage (the VDD rail voltage), and a second current node labeled WL' at node 30. A second NMOS transistor 28 has a first current node coupled to the word line WL at node 24, a second current node coupled to a boosted word clock line WLCLK at node 38, and a gate coupled to the second current node WL' of the first NMOS transistor 26 at node 30. The value of the peak voltage for the WLCLK signal is ideally at least VDD+VTN+ VMARGIN volts. In operation, WLEN is first driven to the VDD power supply voltage. This drives WL' to VDD−VTN. The WLCLK signal is subsequently driven to a boosted voltage level. This transition of the WLCLK signal couples back onto the WL' node 30, boosting it to a voltage even higher than the WLCLK boosted level, resulting in no voltage drop across transistor 28, thus driving the word line to the desired elevated potential.

While the prior art memory array 40 achieves superior performance by the boosting of the word lines, it is also has several disadvantages. The disadvantages of the charge pump method are the area consumption required for the storage capacitor associated with the charge pump and attendant control circuitry, synchronized timing for the signals that control the charge pump, power consumption and undesirable leakage current associated with the charge pump, additional overhead time due to the initializing of the charge pump upon power up, and the potential for device breakdown resulting from the global routing of an elevated potential.

What is desired is a compact circuit arrangement for boosting the voltage level of internal nodes, word lines, word line segments or the like in an integrated circuit ferroelectric memory array or other integrated circuit having utilizing a ferroelectric process that overcomes the disadvantages of the MOS capacitor and charge pump prior art techniques.

SUMMARY OF THE INVENTION

It is, therefore, a principal object of the present invention to provide a compact bootstrapping circuit for any integrated circuit requiring a boosted internal voltage and utilizing a ferroelectric process.

It is a further object of the present invention to provide a compact bootstrapping circuit for driving the word lines in a memory array to an elevated voltage above the available external VDD power supply voltage.

It is an advantage of the invention that the bootstrapping circuit of the present invention can be designed to have about the same layout pitch as a row of ferroelectric memory cells.

It is another advantage of the invention that the bootstrapping circuit does not materially increase the die size of the integrated memory circuit.

It is another advantage of the invention that the bootstrapping circuit does not use P-channel transistors or complementary word lines.

It is another advantage of the invention that an additional external voltage or charge pump is not required to boost the word lines to a voltage above the VDD power supply voltage.

According to the present invention, a ferroelectric memory array includes a word line coupled to a plurality of ferroelectric memory cells and a word line driver circuit for establishing a full power supply voltage on the word line. A bootstrapping circuit is coupled between the word line and a boost line for receiving a boost signal. The bootstrapping circuit includes a ferroelectric capacitor and coupling circuitry for coupling the ferroelectric capacitor between the boost line and the word line in a first operational mode such that the peak voltage on the word line is greater than the power supply voltage, and for isolating the ferroelectric capacitor from the boost line in a second operational mode.

In a first embodiment of the bootstrapping circuit, one plate of the ferroelectric capacitor is coupled directly to the word line. A first transistor is coupled between an intermediate node and the word line, and the gate is coupled to the VDD power supply. A second transistor is coupled between the boost line and the other plate of the ferroelectric capacitor, and the gate is coupled to the intermediate node.

In a second embodiment of the bootstrapping circuit, one plate of the ferroelectric capacitor is coupled directly to the word line. A first transistor is coupled between an intermediate node and the word line, and the gate receives a control signal for tailoring the word line voltage waveform. A second transistor is coupled between the boost line and the other plate of the ferroelectric capacitor, and the gate is coupled to the intermediate node.

In operation, a selected word line is precharged to a full VDD power supply voltage, the ferroelectric capacitor associated with the selected word line is coupled to the boost line, the ferroelectric capacitors associated with non-selected word lines are electrically isolated from the boost line, and the boost line transitions from zero volts to VDD such that the voltage on the selected word line is boosted to a voltage greater than the VDD power supply voltage.

The foregoing and other objects, features and advantages of the invention will become more readily apparent from the following detailed description of a preferred embodiment of the invention which proceeds with reference to the accompanying drawings.

DETAILED DESCRIPTION

Figure 1:
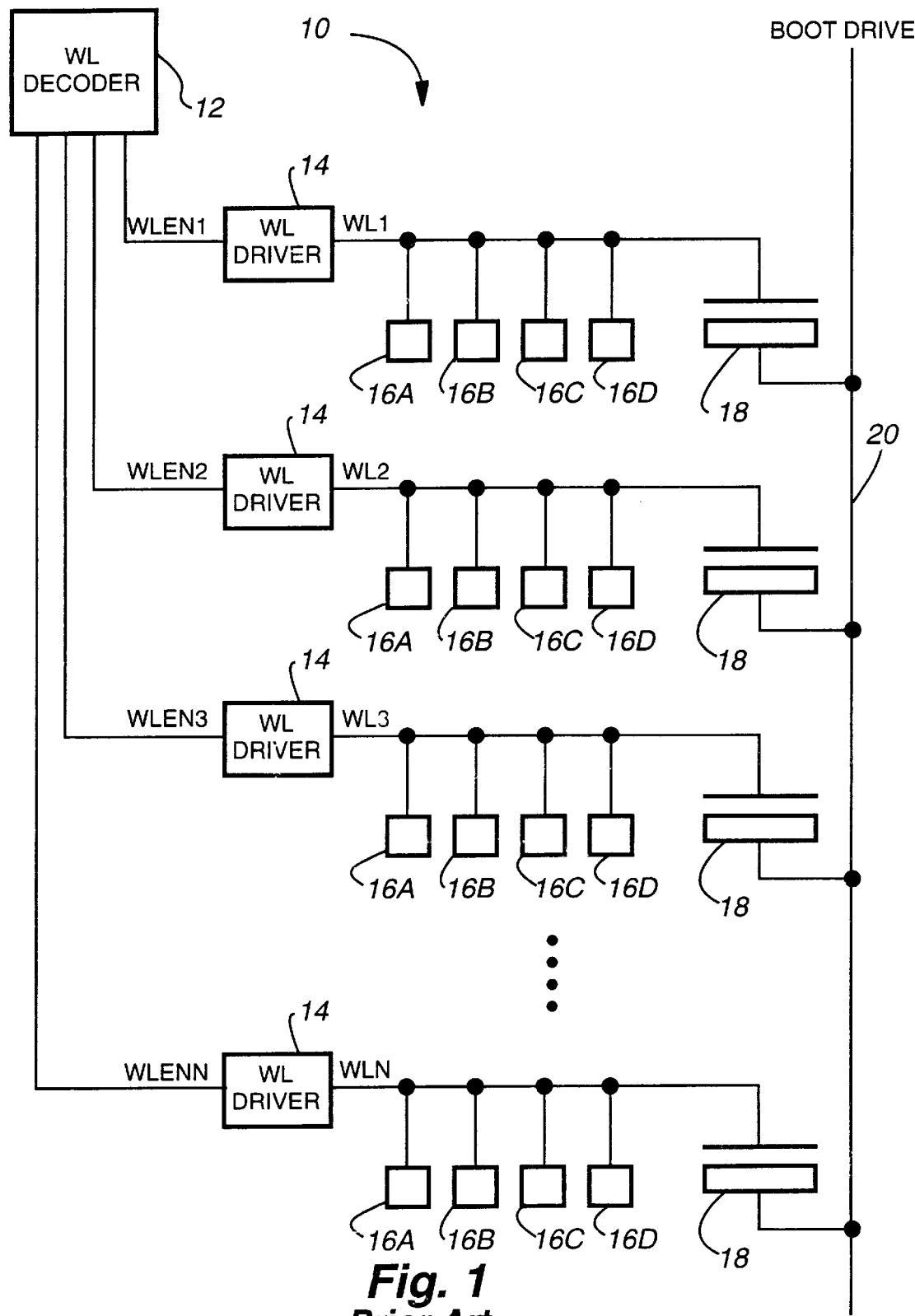
FIG. 1 is combined circuit and block diagram of a portion of a ferroelectric memory array including a prior art MOS capacitor word line boost circuit.
Figure 2:
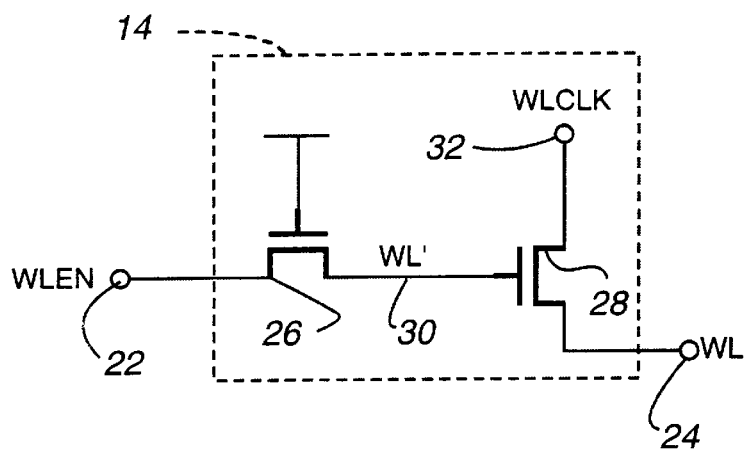
FIG. 2 is a circuit diagram of the word line driver circuit block shown in FIG. 1.
Figure 3:
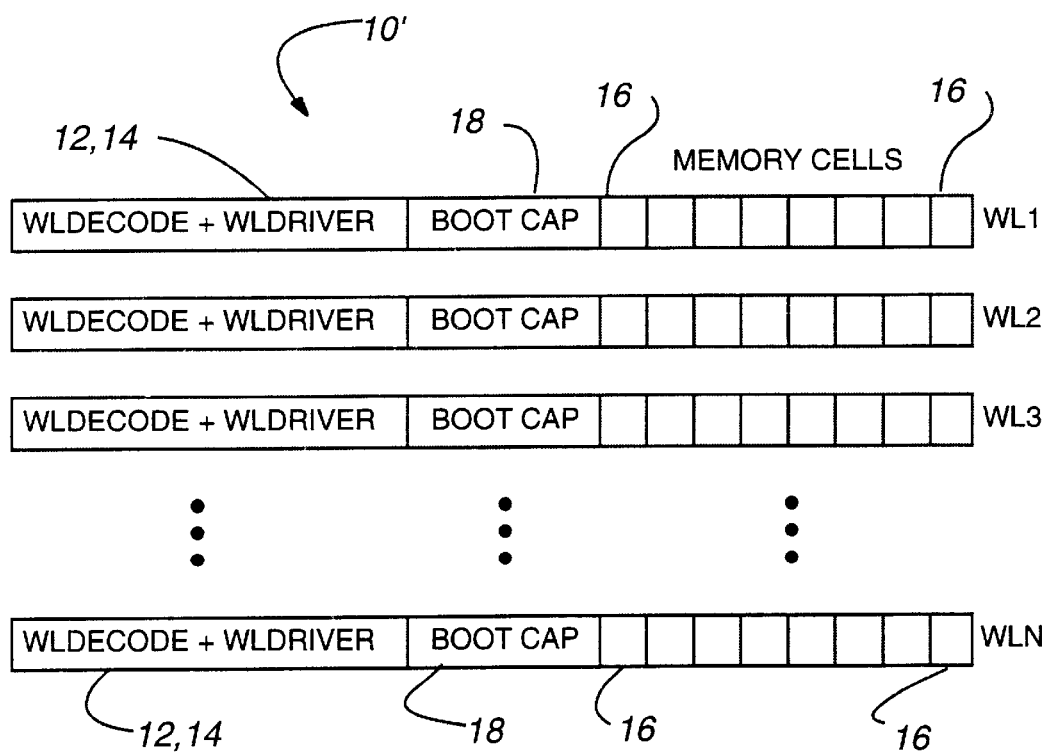
FIG. 3 is a layout diagram showing the MOS capacitor and associated circuitry fitting into the pitch of a row of ferroelectric memory cells, and the resultant undesirable low array efficiency.
Figure 4:
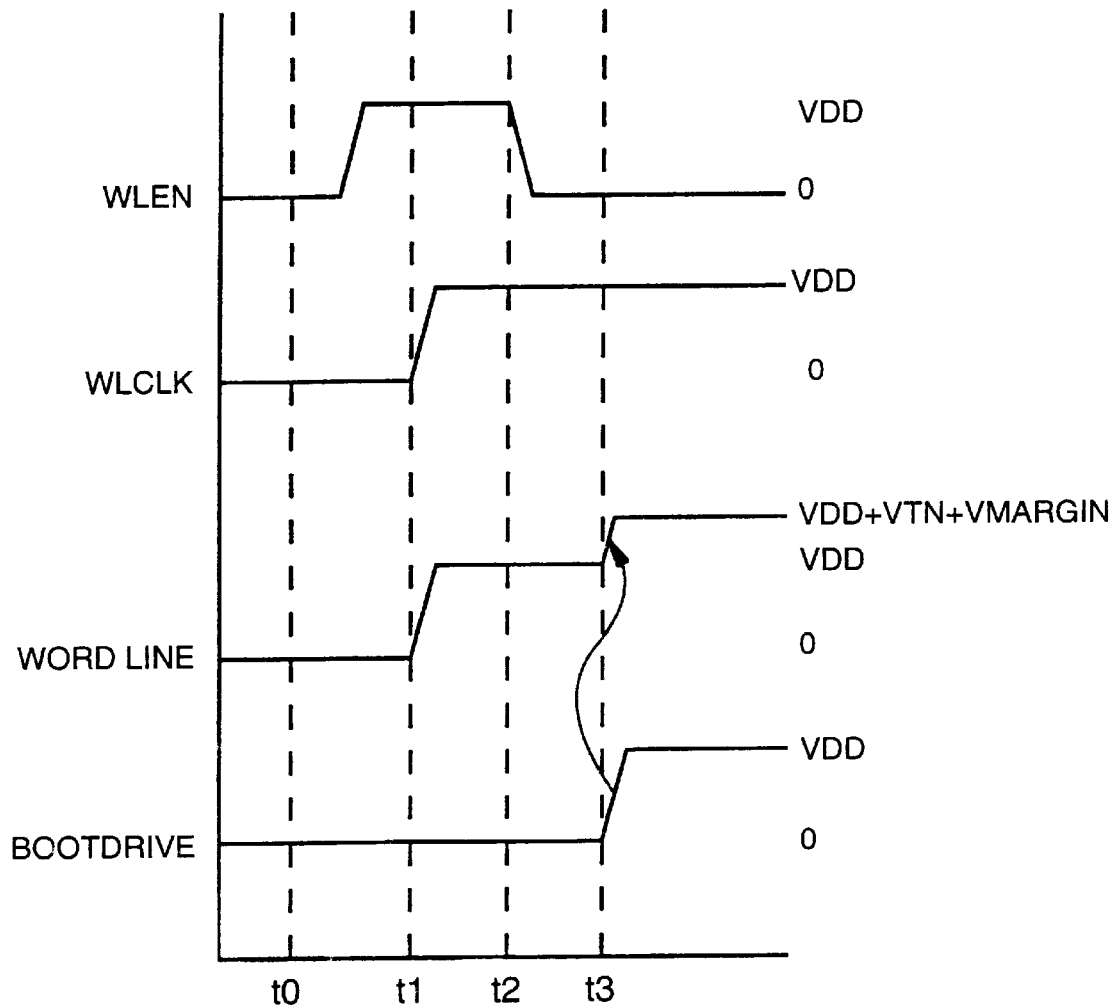
FIG. 4 is a timing diagram associated with the memory circuit of FIG. 1.
Figure 5:
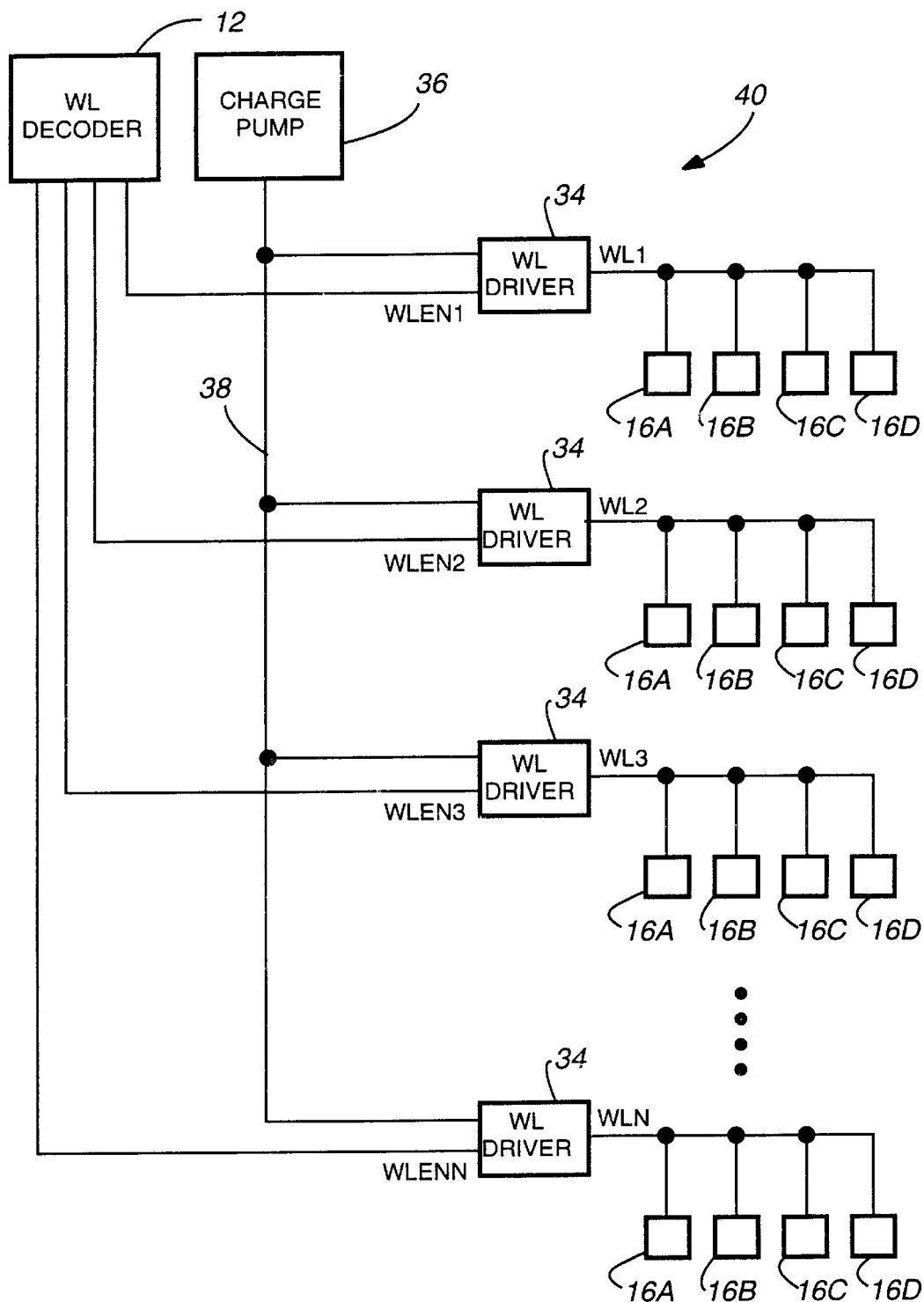
FIG. 5 is a block diagram of a portion of a ferroelectric memory array including a prior art charge pump word line boost circuit.
Figure 6:
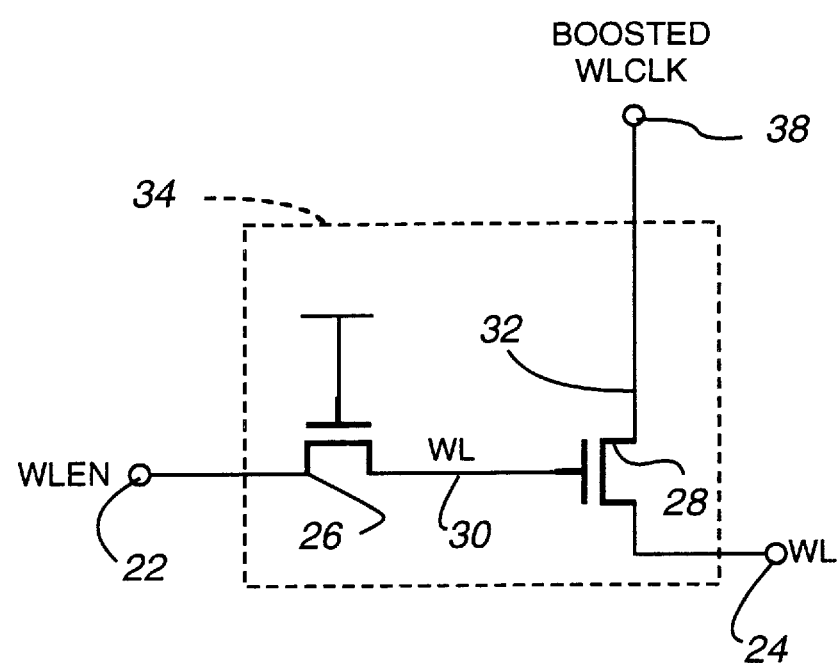
FIG. 6 is a circuit diagram of the word line driver circuit block shown in FIG. 5.
Figure 7:
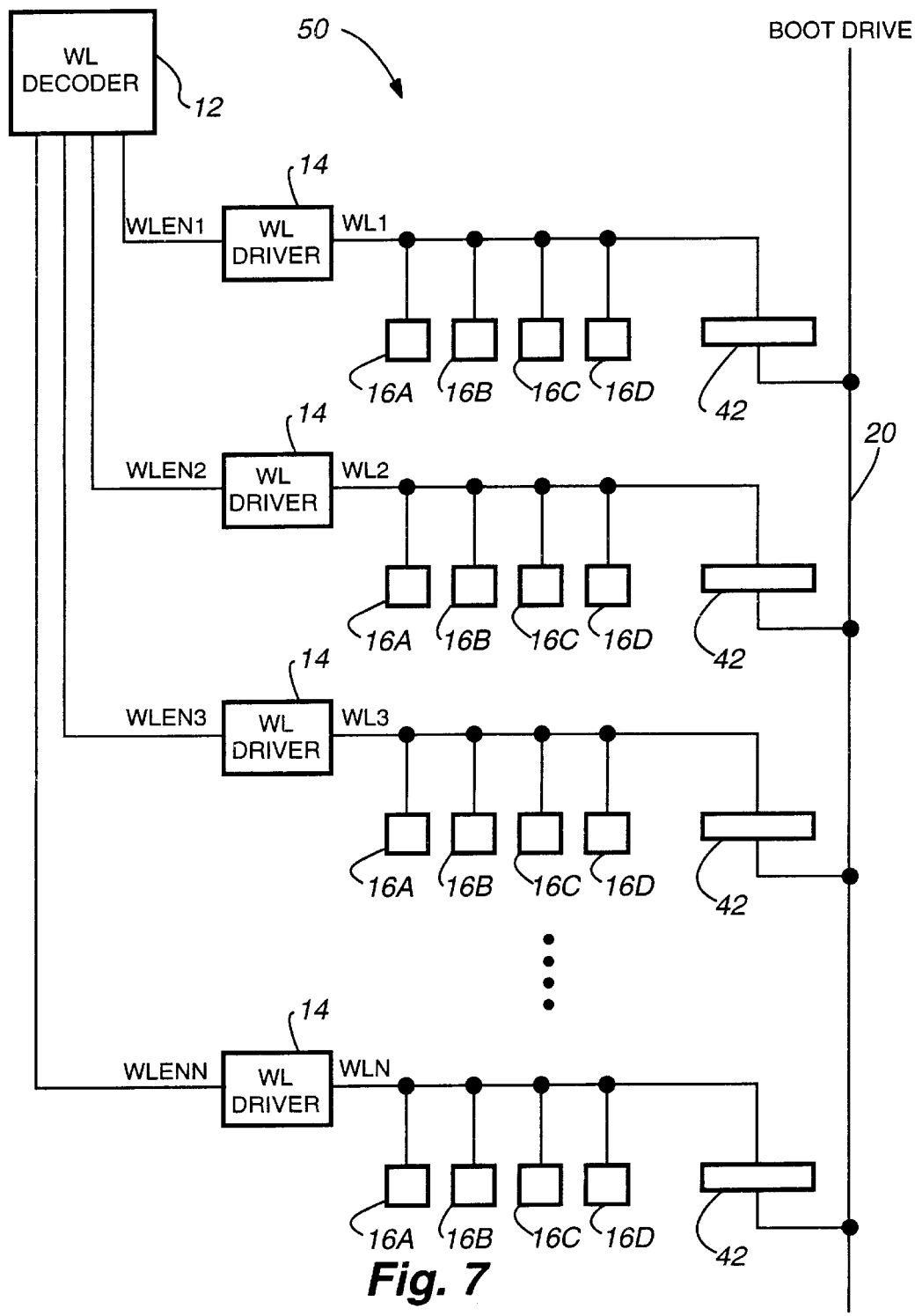
FIG. 7 is a circuit diagram of a portion of a ferroelectric memory array including a ferroelectric word line boost circuit according to the present invention.

A portion of a ferroelectric nonvolatile random access memory array 50 is shown in FIG. 7, including a ferroelectric word line bootstrapping circuit according to the present invention. The memory array 50 is identical to the prior art memory array 10 described with reference to FIG. 1, except that the MOS capacitors 18 have been replaced with a ferroelectric bootstrapping circuit 42, which is described in further detail below. Thus, memory array 50 includes a word line decoder 12 for providing a word line enable signal to a column of word line driver circuits 14. Driver circuits 14 are identical to those described with reference to FIG. 2. Four word line driver circuits 14 are shown receiving word line enable signals WLEN1, WLEN2, WLEN3, and WLENN. Word line drivers 14 provide a full VDD power supply voltage to word lines WL1, WL2, WL3, and WLN. Four representative ferroelectric memory cells 16A–16D are shown coupled to each word line. Each of the word lines are coupled to a single BootDrive line 20 through a ferroelectric bootstrapping circuit 42. Each bootstrapping circuit 42 includes a ferroelectric capacitor and two NMOS transistors.

Each bootstrapping circuit 42 mimics an MOS capacitor 18 in that it provides a maximum capacitive load to the BootDrive line 20 only if the corresponding word line is selected. Additionally, bootstrapping circuits 42 are designed so that no coupling occurs to the deselected word lines.

Figure 8:
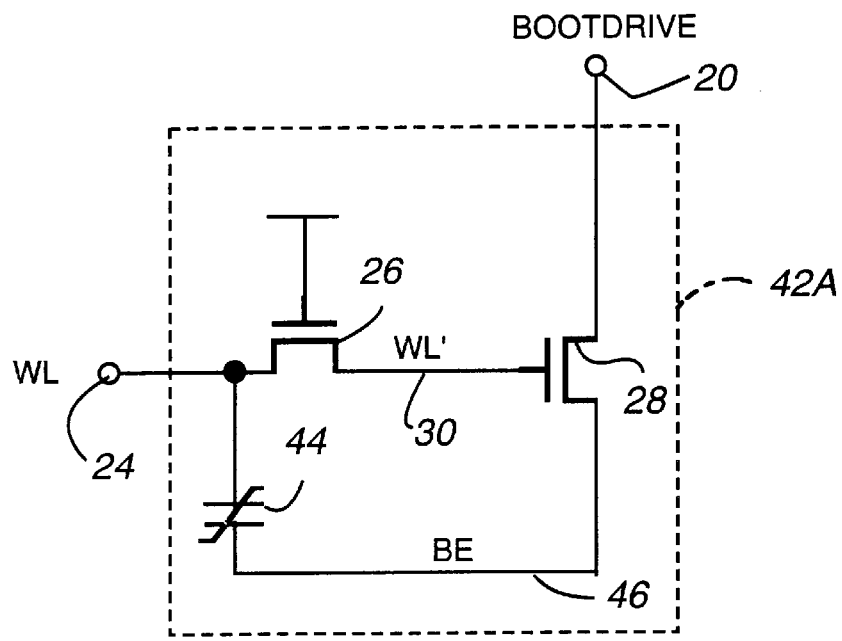
FIG. 8 is a circuit diagram of a first embodiment of the bootstrapping circuit block shown in FIG. 7.

Referring now to FIG. 8, a schematic diagram is shown for a first embodiment 42A of bootstrapping circuit 42. Bootstrapping circuit 42A includes ferroelectric capacitor 44 having a plate coupled to the word line at node 24. Ferroelectric capacitor 44 can include a lead zirconate titanate ("PZT"), strontium bismuth tantalate ("SBT"), or other known ferroelectric dielectric layer. Bootstrapping circuit 42A further includes a first NMOS transistor 26 having a first current node (drain/source node) coupled to the word line WL at node 24. Transistor 26 also includes a gate coupled to a source of supply voltage (the VDD rail voltage), and a second current node (drain/source node) labeled WL' at intermediate node 30. A second NMOS transistor 28 has a first current node (drain/source node) coupled between a BootDrive node 20 and the other plate of ferroelectric capacitor 44 at node 46 designated BE. Transistor 28 also includes a gate coupled to intermediate node 30. For the bootstrapping circuit 42A shown in FIG. 8, the W/L (gate width to gate length) ratio of transistor 26 should be about one fifth (20%) of the W/L ratio of transistor 28. The capacitance of ferroelectric capacitor 44 should be about the same as the word line capacitance, as is explained in further detail below.

Figure 9:
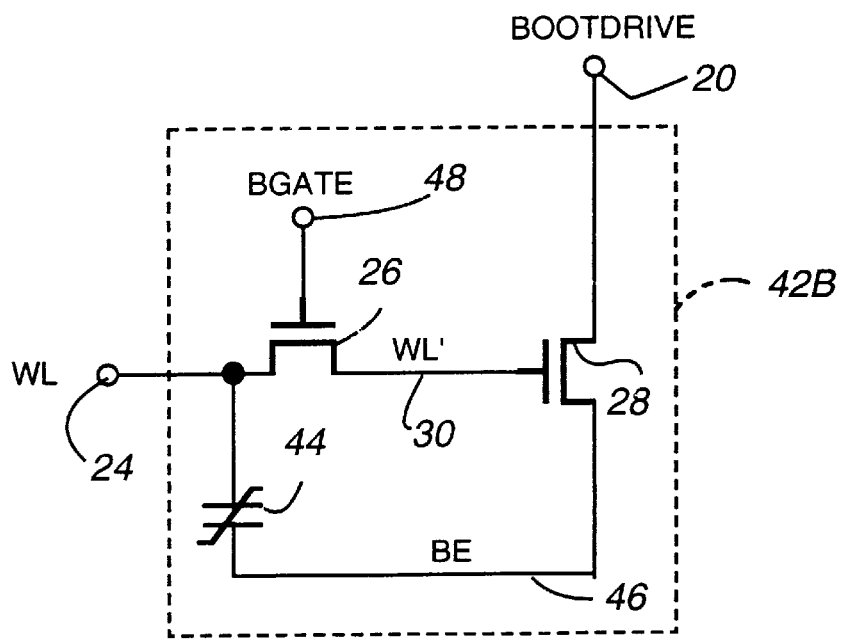
FIG. 9 is a circuit diagram of a second embodiment of the bootstrapping circuit block shown in FIG. 7.

Referring now to FIG. 9, a schematic diagram is shown for a second embodiment 42B of bootstrapping circuit 42. Bootstrapping circuit 42B includes ferroelectric capacitor 44 having a plate coupled to the word line at node 24. Bootstrapping circuit 42A further includes a first NMOS transistor 26 having a first current node (drain/source node) coupled to the word line WL at node 24. Transistor 26 also includes a gate for receiving a control signal Bgate at node 48, and a second current node (drain/source node) labeled WL' at intermediate node 30. A second NMOS transistor 28 has a first current node (drain/source node) coupled between a BootDrive node 20 and the other plate of ferroelectric capacitor 44 at node 46 designated BE. Transistor 28 also includes a gate coupled to intermediate node 30. For the bootstrapping circuit 42B shown in FIG. 9, the W/L (gate width to gate length) ratio of transistor 26 should be about one fifth of the W/L ratio of transistor 28. The capacitance of ferroelectric capacitor 44 should be about the same as the word line capacitance.

Figure 10:
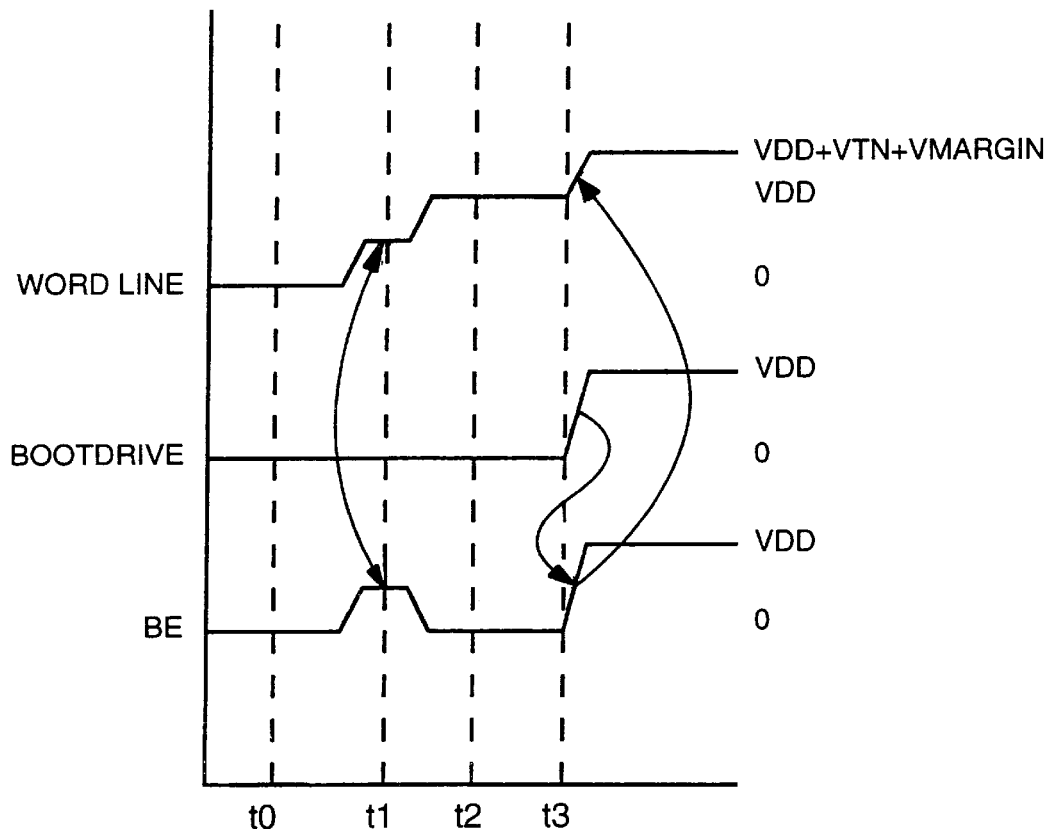
FIG. 10 is a timing diagram associated with the memory circuit of FIG. 7 including the bootstrapping circuit of FIG. 8.

The operation of the first embodiment of the word line boosting scheme is illustrated by the timing diagram of FIG. 10. Specifically, this timing diagram illustrates the operation of the memory array 50 including bootstrapping circuits 42A. At some initial time t0, the word line or segment, the BootDrive line 20, and the BE node are all at ground potential. At time t1, the word line begins the transition to a full VDD potential. Since the BE node 46 is "floating" its potential will also temporarily start to rise. At time t2, the word line signal WL has reached the full VDD potential and the WL' signal has reached a voltage of $VDD-V_{TN}$. Therefore, transistor 28 is on, which brings the BE node 46 back down to ground potential. At time t3, the BootDrive signal on line 20 is brought high, which boosts the level of the word line to a voltage above the VDD power supply voltage, ideally to a level of at least $VDD+V_{TN}+VMARGIN$ volts. The increased voltage ensures that there will be no voltage drop across the access transistor inside the ferroelectric memory cell, and therefore the full VDD voltage is available to polarize the ferroelectric capacitor in the cell. During the operation of the first embodiment of the word line boosting scheme, the polarization should not be switched in ferroelectric capacitor 44. After time t3, the initial conditions can be safely restored as long as the voltage on BE node 46 does not exceed the voltage on the word line. To accomplish this condition, the BootDrive signal should be brought low before the WL signal is brought low. Once these signals are brought low in the manner specified, another cycle may then commence.

Note that the nonselected word lines are at ground potential, and thus the operating condition is the same as that described immediately above at initial time t0. Thus, the ferroelectric capacitor 44 is electrically isolated from the BootDrive line 20 through the off transistor 28. Further, any coupling into node WL' is quickly discharged since transistor 26 is fully on.

Figure 11:
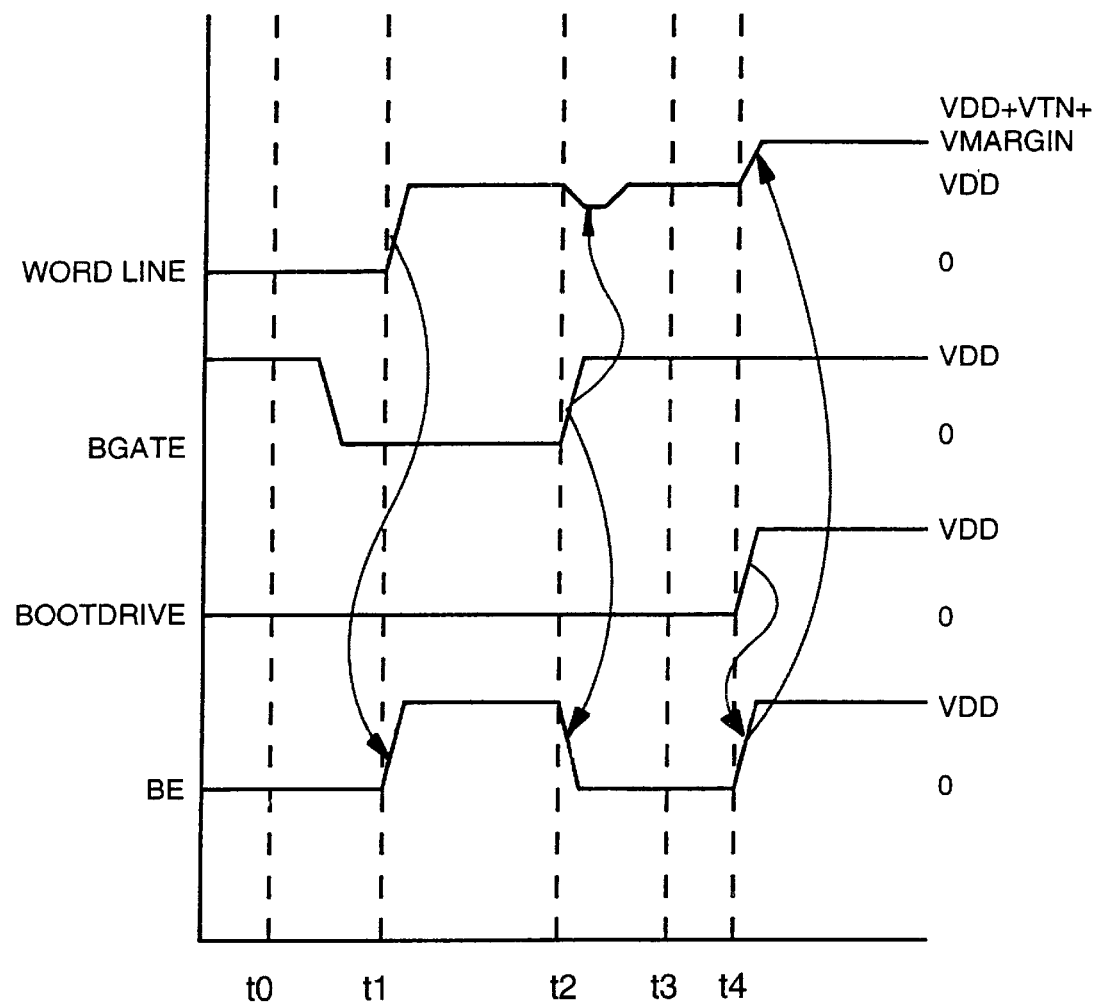
FIG. 11 is a timing diagram associated with the memory circuit of FIG. 7 including the bootstrapping circuit of FIG. 9.

The operation of the second embodiment of the word line boosting scheme is illustrated by the timing diagram of FIG. 11. Specifically, this timing diagram illustrates the operation of the memory array 50 including bootstrapping circuits 42B. At some initial time t0, the word line or segment, the BootDrive line 20, and the BE node are all at ground potential. The Bgate node 48 is at VDD, which insures that WL' is low. At some time between t0 and t1 Bgate goes low, allow as little time as possible for the WL' node to float. At time t1, the word line transitions to a full VDD potential. Since the Bgate node 48 is low, transistors 26 and 28 are off and BE node 46 is floating. Therefore, the 13E node 46 follows the word line voltage. At time t2, the Bgate voltage transitions to the full VDD potential. At time t2, transistor 28 is now turned on, forcing the BE node 46 to ground potential, and temporarily reducing the word line potential at node 24. At time t3, the word line driver has completely charged the ferroelectric capacitor 44 to the full VDD potential, while the BE node remains low. At time t4, the BootDrive signal on line 20 is brought high, which transitions the BE node to VDD through the self-bootstrapping of transistor 28. The level of the word line is boosted to a voltage above the VDD power supply voltage, ideally to a level of at least VDD+$V_{TN}$+VMARGIN volts. During the operation of the second embodiment of the word line boosting scheme, the polarization should not be switched in ferroelectric capacitor 44. After time t4, the initial conditions can be safely restored as long as the voltage on BE node 46 does not exceed the voltage on the word line. To accomplish this condition, the BootDrive signal should be brought low before the WL is brought low.

The reason for the additional Bgate signal and alternative timing in FIG. 11 is that although a temporary voltage fluctuation on the word line still occurs, it occurs immediately after time t2 (instead of at time t1 in FIG. 10). Having the voltage fluctuation occur at time t2 does not add to memory access time, because the reading of the memory cell typically occurs between times t1 and t2. The restoration of the critical data state requiring full transfer of VDD to the bit line occurs after time t4, which is the only time the boosted word line voltage is typically required.

Again, with reference to FIG. 11, note that the nonselected word lines are at ground potential, and thus the operating condition is the same as that described immediately above at initial time t0. Thus, the ferroelectric capacitor 44 is electrically isolated from the BootDrive line 20 through the off transistor 28.

Figure 12:
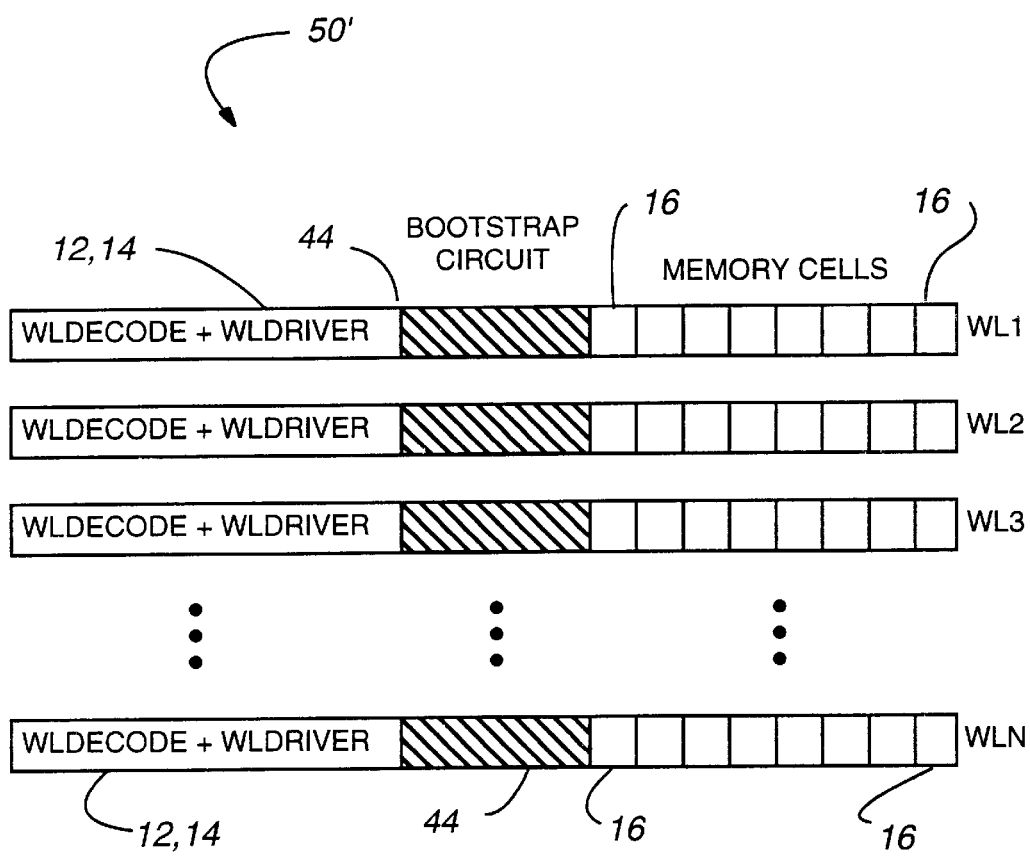
FIG. 12 is a layout diagram showing the bootstrapping circuit of the present invention fitting into the pitch of a row of ferroelectric memory cells, and the resultant desirable high array efficiency.

Referring now to FIG. 12, a layout diagram is shown for the memory array 50 shown in FIG. 7. The layout 50' includes four rows, or word line segments labeled WL1 through WLN. Each row includes word line decode and word line driver circuitry 12 and 14, labeled WLDECODE+WLDRIVER. The aspect ratio of this circuitry is about 20:1. Each row also includes a bootstrap circuit 44 for boosting the voltage level of the word line. The aspect ratio of the bootstrap circuit is about 4:1 or less. Each row also includes the memory cells 16 associated with the word line or word line segment. In FIG. 12, eight such cells are associated with each word line or segment, with each cell having an aspect ratio of about 1:1. Thus the total aspect ratio of the word line drivers and bootstrapping circuit has been reduced from 40:1 to 24:1, resulting in a significant area savings for the integrated circuit.

Having described and illustrated the principles of the invention in a preferred embodiment thereof, it is appreciated by those having skill in the art that the invention can be modified in arrangement and detail without departing from such principles. For example, although the bootstrapping circuit of the present invention has been described in detail with respect to boosting the word line voltage of a ferroelectric memory array, any integrated circuit requiring a boosted internal voltage and utilizing a ferroelectric process can be substituted. Further, a margin voltage of 0.5 volts is typically used, but can be changed if required due to process variations, power supply variations, and other design considerations. The timing diagrams of FIGS. 10 and 11 can be changed as required. The layout diagram of FIG. 12 is one example of a suggested layout for realizing the area savings contemplated by the present invention, but other layout plans can be used. We therefore claim all modifications and variation coming within the spirit and scope of the following claims.

We claim:

1. A bootstrap circuit comprising:
   an input node for receiving an input signal;
   an output node for providing an output signal;
   a ferroelectric capacitor including a first plate coupled to the output node, and a second plate; and
   coupling means including a first transistor having a current path coupled between an intermediate node and the output node, and a control node coupled to a source of power supply voltage, and a second transistor having a current path coupled between the input node and the second plate of the ferroelectric capacitor, and a control node coupled to the intermediate node for coupling the ferroelectric capacitor between the input node and the output node in a first operational mode such that the peak voltage of the output signal is greater than the peak voltage of the input signal, and for isolating the ferroelectric capacitor from the input node in a second operational mode.

2. A bootstrap circuit as in claim 1 in which the first and second transistors each comprise an N-channel MOS transistor.

3. A bootstrap circuit comprising:
   an input node for receiving an input signal;
   an output node for providing an output signal;
   a ferroelectric capacitor including a first plate coupled to the output node, and a second plate; and
   coupling means including a first transistor having a current path coupled between an intermediate node and the output node, and a control node for receiving a control signal, and a second transistor having a current path coupled between the input node and the second plate of the ferroelectric capacitor, and a control node coupled to the intermediate node for coupling the ferroelectric capacitor between the input node and the output node in a first operational mode such that the peak voltage of the output signal is greater than the peak voltage of the input signal, and for isolating the ferroelectric capacitor from the input node in a second operational mode.

4. A bootstrap circuit as in claim 3 in which the first and second transistors each comprise an N-channel MOS transistor.

5. A ferroelectric memory array comprising:
   a word line coupled to a plurality of ferroelectric memory cells;
   a word line driver circuit for establishing a full power supply voltage on the word line;
   a ferroelectric capacitor;
   a boost line for receiving a boost signal; and
   coupling means for coupling the ferroelectric capacitor between the boost line and the word line in a first operational mode such that the peak voltage on the word line is greater than the power supply voltage, and for isolating the ferroelectric capacitor from the boost line in a second operational mode.

6. A bootstrap circuit as in claim 5 in which the ferroelectric capacitor includes a first plate coupled to the word line, and a second plate, and the coupling means comprises:
   a first transistor having a current path coupled between an intermediate node and the word line, and a control node coupled to a source of power supply voltage; and
   a second transistor having a current path coupled between the boost line and the second plate of the ferroelectric capacitor, and a control node coupled to the intermediate node.

7. A bootstrap circuit as in claim 6 in which the first and second transistors each comprise an N-channel MOS transistor.

8. A bootstrap circuit as in claim 5 in which the ferroelectric capacitor includes a first plate coupled to the word line, and a second plate, and the coupling means comprises:
   a first transistor having a current path coupled between an intermediate node and the word line, and a control node for receiving a control signal; and a second transistor having a current path coupled between the boost line and the second plate of the ferroelectric capacitor, and a control node coupled to the intermediate node.

9. A bootstrap circuit as in claim 8 in which the first and second transistors each comprise an N-channel MOS transistor.

10. A bootstrap circuit as in claim 5 in which the word line driver circuit further comprises means for electrically isolating the word line driver circuit from the word line.

11. A bootstrap circuit as in claim 5 in which the ferroelectric memory cells comprise one-transistor, one-capacitor ferroelectric memory cells.

12. A bootstrap circuit as in claim 5 in which the ferroelectric memory cells comprise two-transistor, two-capacitor ferroelectric memory cells.

13. A bootstrap circuit as in claim 5 in which the ferroelectric material used in the ferroelectric memory cells and the ferroelectric capacitor is the same.

14. A bootstrap circuit as in claim 13 in which the ferroelectric material comprises PZT.

15. A bootstrap circuit as in claim 13 in which the ferroelectric material comprises SBT.

16. A method of operating a ferroelectric memory array including a plurality of word lines each coupled to a ferroelectric capacitor, the method comprising the steps of:

precharging a selected word line to a full VDD power supply voltage;

coupling the ferroelectric capacitor associated with the selected word line to a boost line;

electrically isolating the ferroelectric capacitors associated with non-selected word lines from the boost line; and voltage stepping the boost line such that the voltage on the selected word line is boosted to a voltage greater than the VDD power supply voltage.

17. The method of claim 16 in which the voltage stepping step comprises the step of voltage stepping the boost line such that the voltage on the selected word line is boosted to a voltage greater than $VDD+V_{TN}+0.5$ volts.

18. The method of claim 16 in which the voltage stepping step comprises the step of voltage stepping the boost line with a voltage step having an incremental voltage of VDD volts.

19. The method of claim 16 further comprising the step of electrically isolating the selected word line from the ferroelectric memory array subsequent to the precharging step.

* * * * *